(12) United States Patent
Furusato et al.

(10) Patent No.: US 10,408,976 B2
(45) Date of Patent: Sep. 10, 2019

(54) LIGHT TRANSMISSIVE MEMBER, TIMEPIECE, AND LIGHT TRANSMISSIVE MEMBER PRODUCTION METHOD

(71) Applicant: SEIKO EPSON CORPORATION, Tokyo (JP)

(72) Inventors: Daiki Furusato, Nagano (JP); Katsumi Suzuki, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 307 days.

(21) Appl. No.: 15/396,888

(22) Filed: Jan. 3, 2017

(65) Prior Publication Data
US 2017/0205538 A1 Jul. 20, 2017

(30) Foreign Application Priority Data

Jan. 19, 2016 (JP) .................................. 2016-007664
Sep. 29, 2016 (JP) .................................. 2016-191741

(51) Int. Cl.
*G02B 1/115* (2015.01)
*G02B 1/16* (2015.01)
(Continued)

(52) U.S. Cl.
CPC .......... *G02B 1/115* (2013.01); *C03C 17/3435* (2013.01); *C03C 17/3452* (2013.01); *C03C 17/42* (2013.01); *C23C 14/10* (2013.01); *C23C 14/34* (2013.01); *G02B 1/02* (2013.01); *G02B 1/16* (2015.01); *G02B 27/0006* (2013.01); *G04C 3/14* (2013.01); *G04C 10/02* (2013.01); *G04G 17/02* (2013.01); *G04R 60/12* (2013.01); *C03C 2217/734* (2013.01); *C03C 2217/76* (2013.01); *C03C 2217/948* (2013.01); *C03C 2218/365* (2013.01); *G04B 39/002* (2013.01); *G04B 39/006* (2013.01)

(58) Field of Classification Search
None
See application file for complete search history.

(56) References Cited

U.S. PATENT DOCUMENTS 5,891,556 A * 4/1999 Anderson ......... B32B 17/10036
204/192.15
2005/0074591 A1* 4/2005 Zagdoun ............. C03C 17/3417
428/212
(Continued)

FOREIGN PATENT DOCUMENTS

EP 2628818 A1 8/2013
JP 2004-271480 A 9/2004
(Continued)

OTHER PUBLICATIONS

The Extended European Search Report for the corresponding European Application No. 17151758.4 dated Jun. 2, 2017.

*Primary Examiner* — Peter A Salamon

(57) ABSTRACT

A light transmissive member includes a substrate having a light transmission property, wherein on one surface of the substrate, an antireflection layer in which a low-refractive index layer composed mainly of silicon oxide ($SiO_2$) and a high-refractive index layer composed mainly of silicon nitride (SiN) are alternately stacked is formed, and on the other surface of the substrate, an antistatic layer including at least a transparent electrically conductive film layer is formed.

19 Claims, 6 Drawing Sheets

(51) Int. Cl.

| | |
|---|---|
| *C03C 17/42* | (2006.01) |
| *C23C 14/10* | (2006.01) |
| *C23C 14/34* | (2006.01) |
| *G02B 1/02* | (2006.01) |
| *C03C 17/34* | (2006.01) |
| *G02B 27/00* | (2006.01) |
| *G04R 60/12* | (2013.01) |
| *G04C 3/14* | (2006.01) |
| *G04C 10/02* | (2006.01) |
| *G04G 17/02* | (2006.01) |
| *G04B 39/00* | (2006.01) |

(56) References Cited

U.S. PATENT DOCUMENTS

| | | |
|---|---|---|
| 2010/0196685 A1 | 8/2010 | Murata et al. |
| 2011/0176396 A1 | 7/2011 | Suzuki |
| 2016/0154146 A1* | 6/2016 | Furusato ............. C03C 17/2456 368/296 |
| 2016/0229741 A1 | 8/2016 | Canova et al. |

FOREIGN PATENT DOCUMENTS

| | | | | |
|---|---|---|---|---|
| JP | 2016-102757 A | 6/2016 | | |
| JP | 2016-102950 A | 6/2016 | | |
| WO | WO-0137006 A1 * | 5/2001 | ............. | B32B 17/10 |
| WO | 2013/141478 A1 | 9/2013 | | |
| WO | 2015/055944 A1 | 4/2015 | | |
| WO | WO-2015055944 A1 * | 4/2015 | ......... | C03C 17/3423 |

\* cited by examiner

LIGHT TRANSMISSIVE MEMBER, TIMEPIECE, AND LIGHT TRANSMISSIVE MEMBER PRODUCTION METHOD

BACKGROUND

1. Technical Field

The present invention relates to a light transmissive member, a timepiece using the light transmissive member as a cover glass, and a light transmissive member production method.

2. Related Art

It is known that in order to enhance the visibility of the display of time or the like, an antireflection layer is formed on a light transmissive member called "cover glass (windscreen)". This antireflection layer is generally constituted by stacking several to several tens layers of inorganic layers having different refractive indices, and in the case where a high hardness and scratch resistance are required for the surface of the cover glass, silicon oxide ($SiO_2$) having a high light transmittance, a low refractive index, and a relatively high hardness is often deposited on the outermost layer of the antireflection layer. For example, JP-A-2004-271480 (Patent Document 1) discloses a technique for forming an antireflection layer, in which silicon oxide is used as the outermost layer and the lowermost layer, and a silicon oxide ($SiO_2$) film and a silicon nitride ($Si_3N_4$) film are alternately stacked, on the surface of a substrate for a cover glass for a timepiece.

However, in the light transmissive member having the antireflection layer disclosed in Patent Document 1, although the visibility can be improved, the antireflection layer is relatively easily electrified, and therefore, has a problem that foreign substances are adhered to the surface by electrification due to static electricity or the like, and a defect such as deterioration of visibility or appearance may occur.

SUMMARY

An advantage of some aspects of the invention is to solve the problem that the light transmissive member having the antireflection layer is easily electrified, and to provide a light transmissive member which has enhanced visibility and also is hardly electrified, a timepiece using the light transmissive member as a cover glass, and a light transmissive member production method.

Application Example 1

A light transmissive member according to this application example is a light transmissive member including a substrate having a light transmission property, wherein on one surface of the substrate, an antireflection layer in which a layer composed of silicon oxide ($SiO_2$) and a layer composed of silicon nitride (SiN) are alternately stacked is formed, and on the other surface of the substrate, an antistatic layer including at least a transparent electrically conductive film layer is formed.

According to this application example, the visibility is enhanced by the antireflection layer formed on one surface of the substrate, and by forming the antistatic layer including the transparent electrically conductive film layer on the other surface of the substrate, electrification of the light transmissive member can be prevented while ensuring the visibility. Further, the layer composed of silicon nitride has an extremely high hardness and the layer composed of silicon oxide has a relatively high hardness, and therefore, the scratch resistance of the antireflection layer can be improved, and also these are easily available and have a good point that the deposition thereof is easily performed using general-purpose equipment.

Accordingly, a light transmissive member, which has excellent visibility and also excellent scratch resistance, and in which a problem such as adhesion of foreign substances due to electrification is suppressed can be relatively easily provided.

Application Example 2

In the light transmissive member according to the above application example, it is preferred that the antistatic layer is formed by alternately stacking a first refractive index layer and a second refractive index layer having a lower refractive index than that of the first refractive index layer, one layer of the first refractive index layers is the transparent electrically conductive film layer, and the other layer is a layer composed of the same material as that of the transparent electrically conductive film layer or a layer composed of silicon nitride, and the second refractive index layer is a layer composed of silicon oxide.

Application Example 3

In the light transmissive member according to the application example, it is preferred that the antistatic layer is formed by alternately stacking a first refractive index layer and a second refractive index layer having a lower refractive index than that of the first refractive index layer, one layer of the first refractive index layers is the transparent electrically conductive film layer, and the other layer is a layer composed of the same material as that of the transparent electrically conductive film layer or a layer composed of silicon nitride, and the second refractive index layer is a layer having a lower refractive index than that of the transparent electrically conductive film layer and that of the layer composed of silicon nitride.

According to Application Examples 2 and 3, along with the antireflection layer formed on one surface of the substrate, an antireflection effect is also imparted to the antistatic layer formed on the other surface of the substrate, and therefore, a light transmissive member having an antistatic effect and also having further enhanced visibility can be provided.

Application Example 4

In the light transmissive member according to the application example, it is preferred that the second refractive index layer is a layer composed of magnesium fluoride ($MgF_2$).

According to this application example, the layer composed of magnesium fluoride can be used as a low-refractive index layer which is stable in the same manner as silicon oxide.

Application Example 5

In the light transmissive member according to the application example, it is preferred that the transparent electrically conductive film layer is a layer composed of a material for forming a transparent electrode.

Preferred examples of the material for forming a transparent electrode include ITO (Indium Tin Oxide) which is widely used for an electrode for a display substrate of a liquid crystal display.

According to this application example, a light transmissive member including an antistatic layer having an excellent antistatic effect can be provided.

Application Example 6

In the light transmissive member according to the application example, it is preferred that the transparent electrically conductive film layer is a titanium oxide layer composed mainly of titanium oxide and containing, as a subcomponent, at least one element selected from the group consisting of niobium (Nb), silicon (Si), zirconium (Zr), tantalum (Ta), aluminum (Al), and hafnium (Hf).

The present inventors found that according to this application example, a light transmissive member including an antistatic layer having an antistatic effect and also having a more excellent antireflection function can be provided.

Application Example 7

In the light transmissive member according to the application example, it is preferred that the antistatic layer is formed by stacking 4 or more layers, and at least a second layer from the outermost layer of the antistatic layer is the transparent electrically conductive film layer.

According to this application example, as the outermost layer of the antistatic layer, a layer composed of silicon oxide or a layer having a lower refractive index than that of the transparent electrically conductive film layer and that of the layer composed of silicon nitride is formed, and as the layer immediately below the outermost layer, a transparent electrically conductive film layer is formed, whereby the transparent electrically conductive film layer is protected. Therefore, the antistatic layer having an antireflection effect and also having a high antistatic effect and high durability on the outermost layer side can be formed.

Application Example 8

In the light transmissive member according to the application example, it is preferred that on the antireflection layer, an antifouling layer composed of fluorine-containing organosilicon compound is formed.

According to this application example, on the antireflection layer formed on one surface of the substrate, an antifouling layer composed of a fluorine-containing organosilicon compound is formed. This antifouling layer is composed of a fluorine-containing organosilicon compound, and therefore exhibits water-repellent and oil-repellent activity so that not only is fouling suppressed, but also extremely high surface smoothness is exhibited. As a result, even if an impact from the outside is applied to the light transmissive member, the impact can be alleviated by the surface smoothness of the antifouling layer, and thus, the abrasion resistance is high. That is, the peel-off of the antireflection layer can be effectively prevented.

The fluorine-containing organosilicon compound may be any as long as it is a compound which has water repellency and oil repellency, and can exhibit an antifouling property.

Application Example 9

In the light transmissive member according to the application example, it is preferred that the light transmissive member is a cover member, and the antireflection layer is formed in a portion on the outside between a portion on the inside and a portion on the outside of the cover member.

According to this application example, the reflection of light incident from the outside of the cover member can be prevented on the incident side, and therefore, an advantage of obtaining a more favorable antireflection effect than in the case where the antireflection layer is formed in a portion on the emission side which is the inside of the cover member is exhibited.

Application Example 10

A timepiece according to this application example includes the light transmissive member according to the above application example, wherein the light transmissive member is provided for a case which houses a timepiece body.

According to this application example, the light transmissive member according to the above application example is included, and therefore, the same operation and effect as described above can be obtained.

The light transmissive member is provided for, for example, a case as a cover glass (windscreen).

Application Example 11

A timepiece according to this application example includes the light transmissive member according to the above application example, a holding member which holds the light transmissive member, and a packing which is provided between the light transmissive member and the holding member and has electrical conductivity.

Even if an antistatic layer is included, when the light transmissive member is cleaned or the like, the light transmissive member is electrified in some cases.

According to this application example, electric charges generated in the light transmissive member escape to the holding member through the packing, and therefore, as compared with the case where the packing has an insulating property, electric charges easily escape from the light transmissive member, and thus, a time required for releasing electric charges can be reduced. Due to this, the adhesion of foreign substances to the light transmissive member can be further suppressed.

Application Example 12

A timepiece according to this application example includes the light transmissive member according to the above application example, a holding member which holds the light transmissive member, and an adhesive which bonds the light transmissive member and the holding member to each other and has electrical conductivity.

According to this application example, electric charges generated in the light transmissive member escape to the holding member through the adhesive, and therefore, as compared with the case where the adhesive has an insulating property, electric charges easily escape from the light transmissive member, and thus, a time required for releasing electric charges can be reduced. Due to this, the adhesion of foreign substances to the light transmissive member can be further suppressed.

Application Example 13

A light transmissive member production method according to this application example is a method for producing the light transmissive member according to the above application example and includes a sputtering step in which the antireflection layer and the antistatic layer are formed by sputtering.

According to the method for forming the antireflection layer and the antistatic layer by sputtering as in this application example, as compared with the case where the antireflection layer and the antistatic layer are formed merely by vapor deposition, not only can the hardness of the antireflection layer and the antistatic layer be improved as a whole, but also excellent adhesion of the antireflection layer and the antistatic layer to the substrate, and also excellent interlayer adhesion of the antireflection layer and the antistatic layer are obtained. As a result, this can contribute to the improvement of the durability of the light transmissive member such as abrasion resistance.

Application Example 14

A light transmissive member production method according to this application example is a method for producing the light transmissive member according to the above application example, wherein as the transparent electrically conductive film layer, niobium-doped titanium dioxide is used, and as the second refractive index layer, a layer composed of silicon oxide is used, and the antistatic layer is formed by performing vapor deposition using an ion-assisted method.

Niobium-doped titanium dioxide is known as a transparent electrically conductive film having high stability and an excellent optical property, however, for example, in the case where a film is formed by a vacuum vapor deposition method, due to the effect of niobium contained as a subcomponent, the film is blackened unless high energy is applied, and so on, and the optical property may be deteriorated.

As in this application example, when vapor deposition is performed by an ion-assisted method, the above-mentioned problem caused by a vacuum vapor deposition method is solved, and a transparent electrically conductive film layer composed of niobium-doped titanium dioxide and having an excellent optical property can be stably formed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings.

Incidentally, in the following respective drawings, in order to make respective layers and respective members have a recognizable size, the respective layers and the respective members are shown at reduced scales different from those of the actual ones in some cases.

First Embodiment

Light Transmissive Member

Figure 1:
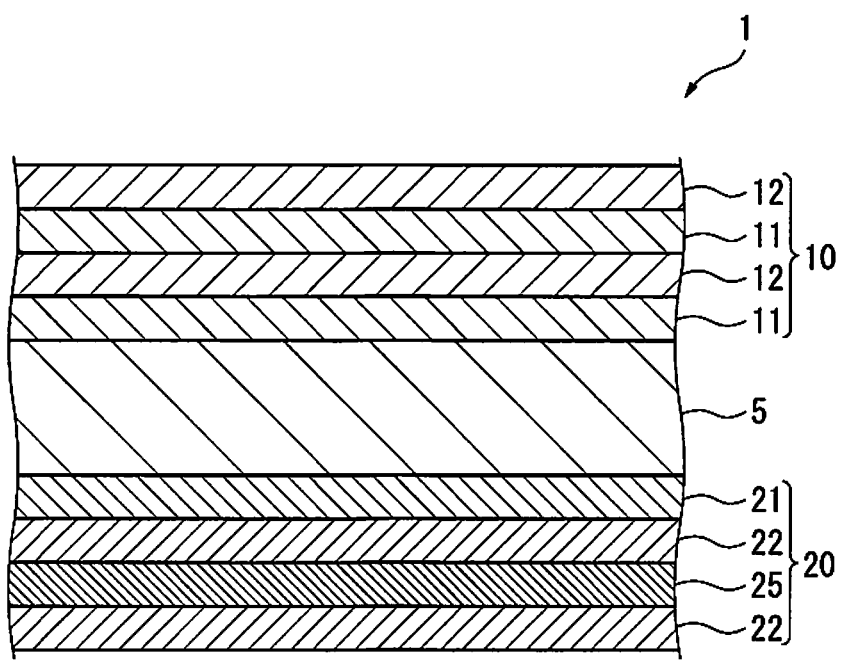
FIG. 1 is a cross-sectional view schematically showing a first embodiment of a light transmissive member according to the invention.

FIG. 1 is a cross-sectional view schematically showing a first embodiment of a light transmissive member according to the invention.

In FIG. 1, a light transmissive member 1 according to the first embodiment includes a substrate 5 having a light transmission property, an antireflection layer 10 formed on one surface of the substrate 5, and an antistatic layer 20 formed on the other surface of the substrate 5.

Material of Substrate

The material of the substrate 5 is an inorganic oxide, and examples thereof include sapphire glass, quartz glass, soda-lime glass, and toughened glass. The light transmissive member 1 is preferably used as a cover member such as a cover glass for a timepiece as described later, and as the material of the cover glass for a timepiece, in particular, sapphire glass is preferred from the viewpoint of hardness and transparency.

Configuration of Antireflection Layer

The antireflection layer 10 is formed on one surface of the substrate 5, and is a multilayer film obtained by alternately stacking inorganic thin films having different refractive indices. In the light transmissive member 1 shown in FIG. 1, the antireflection layer 10 is formed from the following 4 layers: a high-refractive index layer 11, a low-refractive index layer 12, a high-refractive index layer 11, and a low-refractive index layer 12.

Here, the high-refractive index layer 11 is composed mainly of silicon nitride ($SiN_x$), and the low-refractive index layer 12 is composed mainly of silicon oxide ($SiO_2$).

The material of the high-refractive index layer 11 is not limited to the above-mentioned silicon nitride, and the high-refractive index layer 11 may be composed of another material having a higher refractive index than that of silicon oxide.

The antireflection layer 10 does not necessarily include 4 layers, but may include 5 or more layers. A larger number of stacked layers is preferred from the viewpoint of enhancement of the antireflection effect. However, when the number of stacked layers is too large, a problem may arise in terms of productivity, and therefore, the number of stacked layers is preferably up to 9.

Configuration of Antistatic Layer

The antistatic layer 20 is formed on the other surface opposite to the surface of the substrate 5 having the antireflection layer 10 formed thereon, and includes at least a transparent electrically conductive film layer 25. The antistatic layer 20 is preferably a multilayer film obtained by alternately stacking a high-refractive index layer (first refractive index layer) and a low-refractive index layer (second refractive index layer). One layer of the high-refractive index layers is the transparent electrically conductive film layer 25, and the other layer is a high-refractive index layer 21 having a higher refractive index than that of the above-mentioned low-refractive index layer 12. In the light transmissive member 1 shown in FIG. 1, the antistatic layer 20 is formed from the following 4 layers: the high-refractive index layer 21, a low-refractive index layer 22, the transparent electrically conductive film layer (high-refractive index layer) 25, and a low-refractive index layer 22, and the transparent electrically conductive film layer 25 is the second layer from the outermost layer (the outermost layer is the low-refractive index layer 22) of the antistatic layer 20.

Here, the high-refractive index layer 21 is composed mainly of, for example, silicon nitride or tantalum oxide or titanium oxide, the low-refractive index layer 22 is composed mainly of silicon oxide or magnesium fluoride ($MgF_2$), and the transparent electrically conductive film layer 25 is formed using a material for forming a transparent electrode such as, for example, ITO (Indium Tin Oxide). Other than ITO, as the material to be used for forming the transparent electrically conductive film layer 25, niobium-doped titanium dioxide ($Ti_{1-x}Nb_xO_2$:TNO), and in addition thereto, a zinc oxide-based transparent electrically conductive film layer (AZO or GZO) formed by doping zinc oxide (ZnO) with a dopant such as aluminum (Al) or gallium (Ga), $SnO_2$:Fe(FTO) formed by doping tin dioxide ($SnO_2$) with iron (Fe), or the like can be used.

The antistatic layer 20 does not necessarily include 4 layers, but may include 5 or more layers. A larger number of stacked layers is preferred from the viewpoint of enhancement of the antireflection effect. However, when the number of stacked layers is too large, a problem may arise in terms of productivity, and therefore, the number of stacked layers is preferably up to 9. Even in the case where 5 or more layers are stacked, the transparent electrically conductive film layer 25 is preferably the second layer from the outermost layer through the low-refractive index layer 22.

As described above, according to the light transmissive member 1 of this embodiment, the following effect can be obtained.

The light transmissive member 1 according to this embodiment is configured such that on one surface of the substrate 5 composed of sapphire or the like and having a light transmission property, the antireflection layer 10 in which the low-refractive index layer 12 composed mainly of silicon oxide and the high-refractive index layer 11 composed mainly of silicon nitride are alternately stacked is formed, and on the other surface of the substrate 5, the antistatic layer 20 having at least the transparent electrically conductive film layer 25 is formed.

According to this, the visibility is enhanced by the antireflection layer 10 formed on one surface of the substrate 5, and by forming the antistatic layer 20 including the transparent electrically conductive film layer 25 on the other surface of the substrate 5, electrification of the light transmissive member 1 can be prevented while ensuring the visibility. Therefore, while enhancing the visibility by the antireflection layer 10, a problem such as adhesion of foreign substances due to electrification of the surface of the light transmissive member 1 can be suppressed by the antistatic layer 20.

Further, the high-refractive index layer 11 composed of silicon nitride has an extremely high hardness and the low-refractive index layer 12 composed of silicon oxide has a relatively high hardness, and therefore, by alternately stacking these layers, the scratch resistance or the like of the antireflection layer 10 can be improved. Further, silicon oxide is relatively easily available and has a good point that the deposition thereof is easily performed using general-purpose equipment. Accordingly, the light transmissive member 1, which has excellent visibility and also excellent scratch resistance, and in which a problem such as adhesion of foreign substances due to electrification is suppressed can be relatively easily provided.

In the light transmissive member 1 according to this embodiment, the antistatic layer 20 formed on the other surface of the substrate 5 is configured such that the transparent electrically conductive film layer 25 or the high-refractive index layer 21 and the low-refractive index layer 22 are alternately stacked.

According to this, along with the antireflection layer 10 formed on one surface of the substrate 5, an antireflection effect is also imparted to the antistatic layer 20 formed on the other surface of the substrate 5, and therefore, the light transmissive member 1 having an antistatic effect and also having further enhanced visibility can be provided.

Further, in this embodiment, the antistatic layer 20 is configured such that 4 or more layers including the high-refractive index layer 21, the low-refractive index layer 22, and the transparent electrically conductive film layer 25 are stacked, and the outermost layer of the antistatic layer 20 is the low-refractive index layer 22, and the second layer from the outermost layer is the transparent electrically conductive film layer 25.

According to this configuration, the outermost layer of the antistatic layer 20 is the low-refractive index layer 22 composed of silicon oxide having a high hardness and high scratch resistance, and the layer immediately below the outermost layer is the transparent electrically conductive film layer 25, and therefore, the transparent electrically conductive film layer 25 is protected. According to this, the antistatic layer 20 having an antireflection effect and also having a high antistatic effect and high durability on the outermost layer side can be formed.

Cover Member (Cover Glass for Timepiece)

The light transmissive member 1 according to this embodiment can be used for, for example, various lenses (including microlenses, lenticular lenses, fresnel lenses, and the like) such as projector lenses, camera lenses, and eyeglass lenses, filters (camera low-pass filters, edge filters, UV cut filters, IR cut filters, and the like), light transmissive plates, dust-proof glasses, radiator plates, and the like.

Further, the light transmissive member 1 can be particularly favorably used as a cover member. Specific examples of the cover member include cover glasses (windscreens) for timepieces, back covers for timepieces, and light transmissive dial plates (for example, dial plates for solar timepieces).

Above all, the light transmissive member 1 is preferably a cover glass for a timepiece.

A cover glass for a timepiece is present at a place close to the point of view of an observer (a user or the like) when using a timepiece, and on a rear surface side of the cover glass, time-displaying members such as a dial plate and hands are generally disposed. Therefore, the cover glass (optical component) is a member which is strongly required to have visibility of a dial plate and the like through the cover glass (optical component). In such a cover glass (the light transmissive member 1), the antireflection layer 10 is formed in a portion on the outside between a portion on the inside and a portion on the outside of the cover glass for a timepiece (the light transmissive member 1). According to this, the reflection of light incident from the outside of the cover glass for a timepiece can be prevented on the incident side, and therefore, an advantage of obtaining a more favorable antireflection effect than in the case where the antireflection layer is formed only in a portion on the emission side which is the inside of the cover glass for a timepiece is exhibited.

Further, the cover glass is a member in which a problem of decreasing the visibility particularly remarkably occurs when dirt such as dust adheres to the cover glass due to static electricity. Further, in the case where the cover glass is undesirably electrified, the hands such as an hour hand may be deformed due to the effect, and therefore, a breakdown or the like of the timepiece may be caused by such deformation. On the other hand, in the case where the light transmissive member 1 according to this embodiment including the antistatic layer 20 is applied to a cover glass for a timepiece, the occurrence of the problem as described above can be effectively prevented. Therefore, by applying the invention to a cover glass for a timepiece, the effect of the invention is more remarkably exhibited.

Further, the cover glass has many opportunities to be seen by an observer (a user or the like), and therefore is a component which has a great influence on the appearance of the timepiece as a whole. Then, in the invention, a high antireflection function is exhibited, and therefore, excellent appearance (aestheticity) originally possessed by an ornamental component such as a dial plate to be seen through the cover glass can be effectively exhibited. Therefore, by applying the invention to the cover glass for a timepiece, the aesthetic appearance of the timepiece as a whole can be made particularly excellent.

In the case of a diver's watch or the like, the visibility through the cover glass sometimes greatly affects the safety of an observer (user), however, according to the invention, a high antireflection function is exhibited, and therefore, also in an optical component for a timepiece to be used in such a severe environment, the effect as described above can be reliably exhibited.

Further, in a diver's watch or the like, liquid tightness in the case is maintained, however, a humidity contained in the case when assembling the watch is dew-condensed during use to cause a problem of decreasing the visibility in some cases. However, according to the invention, the antireflection layer has a high antireflection function, and also has a high antifogging property, and therefore, for example, in a diver's watch, by disposing a cover glass (optical component), to which the invention is applied, such that a surface provided with the antireflection layer faces the inner surface side, the problem of dew condensation as described above can be more reliably prevented.

Second Embodiment

Figure 2:
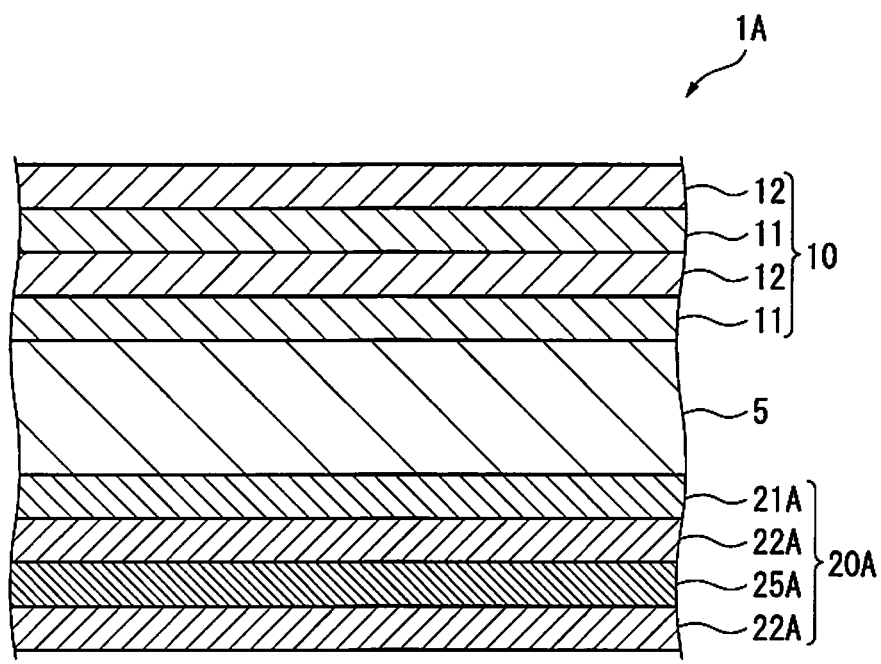
FIG. 2 is a cross-sectional view schematically showing a second embodiment of a light transmissive member according to the invention.

FIG. 2 is a cross-sectional view schematically showing a second embodiment of the light transmissive member according to the invention.

Hereinafter, the light transmissive member according to the second embodiment will be described with reference to FIG. 2. The same constituent members as those of the first embodiment are denoted by the same reference numerals, and the repeated description thereof will be omitted.

In a light transmissive member 1A according to this embodiment shown in FIG. 2, an antireflection layer 10 formed on one surface of a substrate 5 has the same configuration as that of the light transmissive member 1 according to the first embodiment (see FIG. 1).

In the light transmissive member 1A according to this embodiment, an antistatic layer 20A formed on the other surface of the substrate 5 includes titanium oxide layers 21A and 25A, and a silicon oxide layer 22A as a low-refractive index layer. Hereinafter, the antistatic layer 20A of this embodiment will be described in detail.

As shown in FIG. 2, in the light transmissive member 1A according to this embodiment, the antistatic layer 20A formed on the other surface of the substrate 5 includes a plurality of titanium oxide layers including the titanium oxide layer 21A as a high-refractive index layer and the titanium oxide layer 25A as a transparent electrically conductive film layer, and a plurality of silicon oxide layers 22A, and has a configuration such that these layers are alternately disposed.

The plurality of titanium oxide layers 21A and 25A constituting the antistatic layer 20A may have the same conditions such as thickness and composition, or may have different conditions. However, the detailed configuration of the titanium oxide layer described below is desirably included at least in the titanium oxide layer 25A as the transparent electrically conductive film layer. Similarly, the plurality of silicon oxide layers 22A constituting the antistatic layer 20A may have the same conditions such as thickness and composition, or may have different conditions. As the silicon oxide layer 22A, it is also possible to use a film formed from magnesium fluoride other than silicon oxide.

In the configuration shown in FIG. 2, the antistatic layer 20A includes two layers of titanium oxide layers 21A and 25A and two layers of silicon oxide layers 22A, however, the number of layers of titanium oxide layers 21A and 25A and the number of layers of silicon oxide layers 22A constituting the antistatic layer 20A is not particularly limited.

In the case where the number of layers of titanium oxide layers 21A and 25A and the number of layers of silicon oxide layers 22A constituting the antistatic layer 20A are each 2 or more and 9 or less, the effect of the first embodiment described above is more remarkably exhibited, and also the light transmissive member 1A can be produced with higher productivity. Further, the antistatic property, the light transmission property, and the like of the light transmissive member 1A can be made particularly excellent.

Titanium Oxide Layer

Hereinafter, the detailed configuration of the titanium oxide layer will be described.

The titanium oxide layers 21A and 25A are high-refractive index layers composed mainly of titanium oxide and containing, as a sub-component, at least one element selected from the group consisting of niobium (Nb), silicon (Si), zirconium (Zr), tantalum (Ta), aluminum (Al), and hafnium (Hf).

The content of titanium (Ti) in the titanium oxide layers 21A and 25A is preferably 45 mass % or more and 75 mass % or less, more preferably 50 mass % or more and 70 mass % or less.

According to this, the refractive index of each of the titanium oxide layers 21A and 25A can be more reliably made favorable, and the antireflection function can be made particularly excellent. Further, while particularly enhancing the light transmission property of each of the titanium oxide layers 21A and 25A, the antistatic function, antifogging property, and the like can be made particularly excellent.

The content of oxygen (O) in the titanium oxide layers 21A and 25A is preferably 25 mass % or more and 55 mass % or less, more preferably 30 mass % or more and 50 mass % or less.

The content of an element (in the case where a plurality of elements are contained, the sum of the contents of these elements) as the sub-component in the titanium oxide layers 21A and 25A is preferably 0.01 mass % or more and 1.0 mass % or less, more preferably 0.05 mass % or more and 0.9 mass % or less.

According to this, while particularly enhancing the light transmission property of each of the titanium oxide layers 21A and 25A, the antifogging property and the like can be made particularly excellent. Incidentally, the titanium oxide layers 21A and 25A also have an antistatic function.

The element as the sub-component may be contained in any form in the titanium oxide layers 21A and 25A, but is preferably an element which forms a complex oxide with titanium.

According to this, the occurrence of a defect in terms of appearance such as color unevenness or the occurrence of a problem such as a decrease in adhesion between the substrate 5 and the antistatic layer 20A can be more effectively prevented.

The sub-component to be contained in the titanium oxide layers 21A and 25A may be any as long as it is at least one element selected from the group consisting of Nb, Si, Zr, Ta, Al, and Hf, but is particularly preferably Nb.

According to this, the refractive index of each of the titanium oxide layers 21A and 25A can be more reliably made favorable, and the antireflection function can be made particularly excellent. Further, the light transmission property and the antistatic function can be achieved at higher levels. In addition, the adhesion to the silicon oxide layer 22A or the like can be made particularly excellent, and the durability and reliability of the light transmissive member 1A can be made particularly excellent.

In the case where Nb is contained in the titanium oxide layers 21A and 25A as the sub-component, the content of Nb in the titanium oxide layers 21A and 25A is preferably 0.01 mass % or more and 1.0 mass % or less, more preferably 0.05 mass % or more and 0.8 mass % or less.

According to this, the effect as described above is more remarkably exhibited.

The ratio of the content of Nb to the total content of the sub-components contained in the titanium oxide layers 21A and 25A is preferably 50 mass % or more, more preferably 60 mass % or more.

According to this, the effect as described above is more remarkably exhibited.

The titanium oxide layers 21A and 25A may contain a component other than the above-mentioned components. Examples of such a component include components to be used for a transparent electrode such as In and Sn.

The thickness of each of the titanium oxide layers 21A and 25A is preferably 5 nm or more and 200 nm or less, more preferably 7 nm or more and 150 nm or less.

According to this, the antireflection function can be made particularly excellent. Further, the durability, antistatic function, and the like of the light transmissive member 1A can be made particularly excellent.

It has been described above that in the titanium oxide layers 21A and 25A, the above-mentioned configuration is preferably included particularly in the titanium oxide layer 25A as the transparent electrically conductive film layer. However, this is for further enhancement of the antistatic effect on the surface layer side of the antistatic layer 20A. The titanium oxide layer 21A on the substrate 5 side of the antistatic layer 20A may have different composition and thickness from those of the titanium oxide layer having the above-mentioned configuration. Further, the material of the titanium oxide layer 21A as the high-refractive index layer is not limited to titanium oxide, and the titanium oxide layer 21A may be composed of another high-refractive index material, and may be, for example, a layer composed of tantalum oxide, silicon nitride, or the like.

Silicon Oxide Layer

The silicon oxide layer 22A can be applied also to the low-refractive index layers 12 and 22 in the light transmissive member 1 according to the first embodiment described above, and is a low-refractive index layer composed mainly of silicon oxide.

By including such a silicon oxide layer 22A along with the above-mentioned titanium oxide layers 21A and 25A, an excellent antireflection function is obtained. Further, by disposing the silicon oxide layer 22A on the outermost surface, an excellent antifogging property as well as scratch resistance can be obtained.

The silicon oxide layer 22A may be any as long as it is constituted by a material containing silicon oxide, and the form of silicon oxide in the silicon oxide layer 22A may be any. For example, the silicon oxide layer 22A may be constituted by silicon oxide in the form of a dense layer, or may be constituted by depositing a plurality of silicon oxide (silica) particles.

The silicon oxide layer 22A constituted by silicon oxide in the form of a dense layer can be favorably formed by, for example, using a vapor deposition method. The above-mentioned titanium oxide layers 21A and 25A can be favorably formed by a vapor deposition method as described in detail later, and therefore, in the case where the silicon oxide layer 22A is formed by a vapor deposition method, the formation of the silicon oxide layer 22A and the formation of the titanium oxide layers 21A and 25A can be favorably performed successively, and therefore, the productivity of the light transmissive member 1A can be made excellent.

Further, the silicon oxide layer 22A constituted by depositing a plurality of silicon oxide (silica) particles can be favorably formed by, for example, using a composition containing silica particles.

When the silicon oxide layer 22A is constituted by depositing a plurality of silica particles, the antireflection function of the antistatic layer 20A as a whole can be made particularly excellent.

This is because in the silicon oxide layer 22A, spaces (air spaces (refractive index: 1.00)) along with regions occupied by silica particles (refractive index: 1.46) are included, and therefore, the refractive index is decreased to lower than that of silica in the bulk form, resulting in obtaining a favorable optical interference effect.

The thickness of the silicon oxide layer 22A is preferably 15 nm or more and 300 nm or less, more preferably 20 nm or more and 280 nm or less.

According to this, the antireflection function can be made particularly excellent. Further, the durability and the like of the light transmissive member 1A can be made particularly excellent. In addition, in the case where the silicon oxide layer 22A contains electrically conductive particles, a synergistic effect with the antistatic layer 20A formed on the other surface of the substrate 5 is exhibited, and thus, the antistatic function and the like of the light transmissive member 1A as a whole can be made particularly excellent.

The thickness of the antistatic layer 20A is preferably 20 nm or more and 500 nm or less, more preferably 27 nm or more and 380 nm or less.

According to this, the antireflection function can be made particularly excellent. Further, the antistatic function and the like of the light transmissive member 1A can be made particularly excellent.

Further, the antistatic layer 20A of this embodiment is configured such that 4 or more layers are stacked, and the outermost layer of the antistatic layer 20A is the silicon oxide layer 22A which is a low-refractive index layer, and at least the second layer from the outermost layer is the titanium oxide layer 25A as a transparent electrically conductive film layer.

According to this configuration, the outermost layer of the antistatic layer 20A is the silicon oxide layer 22A composed of silicon oxide having a high hardness and high scratch resistance, and the layer immediately below the outermost layer is the titanium oxide layer 25A as a transparent electrically conductive film layer, and therefore, the titanium oxide layer 25A is protected, and thus, the antistatic layer 20A having an antireflection effect and also having a high antistatic effect and high durability on the outermost layer side can be formed.

As described above, according to the light transmissive member 1A of this embodiment, in addition to the effect of the first embodiment, the antireflection function can be made further excellent. In addition, in the transmissive member 1A including the antistatic layer 20A, the antistatic function and the like can be made particularly excellent.

The invention is not limited to the above-mentioned embodiments, and various changes, improvements, and the like can be made to the above-mentioned embodiments. Hereinafter, a modification will be described.

Modification

Figure 3:
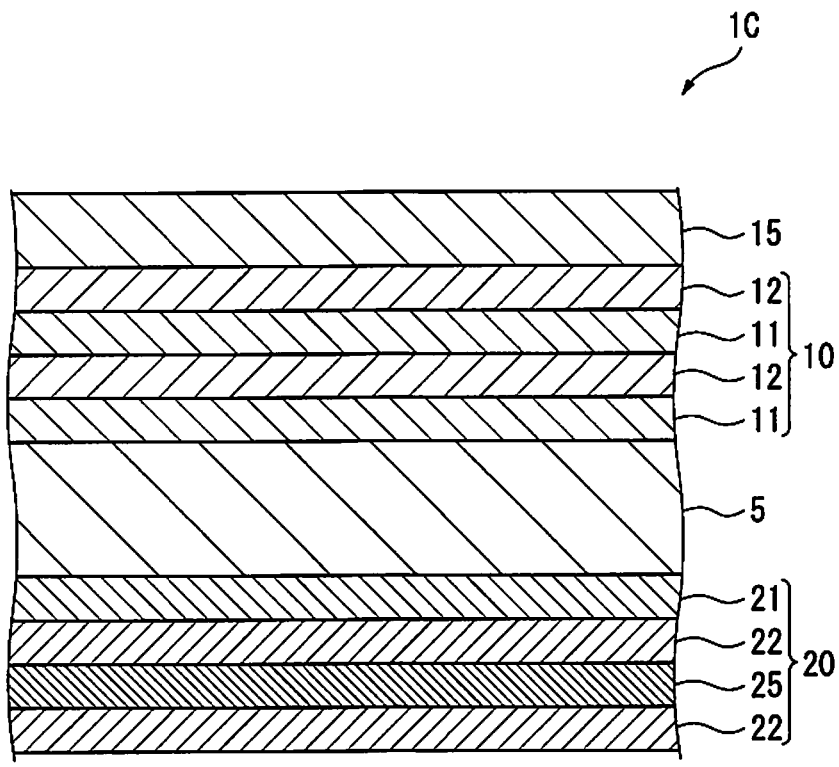
FIG. 3 is a cross-sectional view schematically showing a modification of a light transmissive member according to the invention.

FIG. 3 is a cross-sectional view schematically showing a modification of the light transmissive member according to the invention.

Hereinafter, a light transmissive member 1C according to a modification will be described. In FIG. 3, a modification of the light transmissive member 1 according to the first embodiment shown in FIG. 1 will be described, however, the configuration of this modification can also be applied to the light transmissive member 1A according to the second embodiment shown in FIG. 2. Further, in the following description of the modification with reference to FIG. 3, the same constituent members as those of the first embodiment are denoted by the same reference numerals, and the repeated description thereof will be omitted.

In FIG. 3, in the light transmissive member 1C according to this modification, an antireflection layer 10 is formed on one surface of a substrate 5, and an antistatic layer 20 is formed on the other surface of the substrate 5 in the same manner as the light transmissive member 1 according to the first embodiment (see FIG. 1) described above. Then, on a low-refractive index layer 12, which is the uppermost layer of the antireflection layer 10, an antifouling layer 15 is formed.

Configuration of Antifouling Layer

The antifouling layer 15 is composed of a compound known as a so-called water-repellent and oil-repellent agent. As such a compound, a fluorine-containing organosilicon compound such as an alkoxysilane is preferred.

Further, as the fluorine-containing organosilicon compound, a compound containing an amino group is also preferred.

By forming the fluorine-containing organosilicon compound on the antireflection layer 10 as the antifouling layer 15, the light transmissive member 1C having an excellent water-repellent and oil-repellent effect and excellent abrasion resistance can be obtained. These fluorine-containing organosilicon compounds may be used alone, but may be used in admixture.

Specific examples of the fluorine-containing organosilicon compound include TSL8233 and TSL8257 manufactured by GE Toshiba Silicones Co. Ltd., Optool DSX manufactured by DAIKIN INDUSTRIES, Ltd., and KY-130 and KP-801 manufactured by Shin-Etsu Chemical Co., Ltd.

As a method for forming the antifouling layer 15, either of a dry method and a wet method can be used. As the dry method, a vacuum vapor deposition method in which the fluorine-containing organosilicon compound is vaporized in a vacuum chamber, and deposited on the surface of the substrate 5 (antireflection layer 10) can be adopted. For example, a vapor deposition apparatus described in JP-A-6-340966 or JP-A-2005-301208 can be favorably used.

In order to form the antifouling layer 15 on the substrate 5 (antireflection layer 10) by the wet method, a method in which any of the above-mentioned fluorine-containing organosilicon compounds is dissolved in an organic solvent, and the concentration thereof is adjusted to a predetermined concentration, and then, the resulting solution is applied to the surface of the substrate 5 can be adopted. As the application method, a dipping method, a spin coating method, a spraying method, a flow method, a doctor blade method, roll coating application, gravure coating application, curtain flow coating, brush coating, or the like is used. The thickness of the antifouling layer 15 is not particularly limited, but is preferably from 0.001 to 0.05 μm, more preferably from 0.001 to 0.03 μm, further more preferably from 0.001 to 0.02 μm.

When the thickness of the antifouling layer 15 is less than 0.001 μm, sufficient water-repellent and oil-repellent performance cannot be exhibited, and also the smoothness is poor, and therefore, the abrasion resistance or chemical resistance may be deteriorated. Further, when the thickness of the antifouling layer 15 exceeds 0.05 μm, the surface hardness of the light transmissive member 1C may be deteriorated, and moreover, the surface light scattering by the antifouling layer 15 is increased, and thus, the transparency of the substrate 5 may be impaired.

According to this modification described above, in addition to the effect of the above embodiment, the effect as follows is obtained.

In the light transmissive member 1C according to this modification, on the antireflection layer 10, the antifouling layer 15 composed of the fluorine-containing organosilicon compound is formed. According to this, this antifouling layer not only exhibits water-repellent and oil-repellent activity, but also has very high surface smoothness. Therefore, even if an impact from the outside is applied to the light transmissive member 1C, the impact can be alleviated by the surface smoothness of the antifouling layer 15, and thus, the abrasion resistance is very high. Accordingly, the visibility of the light transmissive member 1C can be maintained over a long period of time.

Further, by using the above-mentioned compound as the fluorine-containing organosilicon compound to be used for the antifouling layer 15, high smoothness can be imparted to the light transmissive member 1C, and as a result, excellent abrasion resistance can be exhibited.

Further, by setting the thickness of the antifouling layer 15 within the range of 0.001 to 0.05 μm, the light transmissive member 1C which can exhibit sufficient water-repellent and oil-repellent performance, and also has excellent abrasion resistance and chemical resistance can be provided.

Further, the hardness of the surface on the antireflection layer 10 side in the light transmissive member 1C, that is, when the light transmissive member 1C is used as a cover member, the surface on a side to become a portion on the outside between a portion on the inside and a portion on the outside of the cover member is 24000 $N/mm^2$ or more, and therefore, in the case where the light transmissive member 1C is applied as a cover member of a wristwatch, a portable information device, or the like, sufficient abrasion resistance is obtained.

Light Transmissive Member Production Method

The light transmissive members 1, 1A, and 1C according to the above-mentioned embodiments and modification can be produced by a production method including a sputtering step in which the high-refractive index layer 11 and the low-refractive index layer 12 constituting the antireflection layer 10, and the transparent electrically conductive film layer 25 or 25A and the low-refractive index layer 22 or 22A having a lower refractive index than that of the forming material of the transparent electrically conductive film layer 25 or 25A or the high-refractive index layer 21 or 21A having a higher refractive index than that of the low-refractive index layer 22 or 22A constituting the antistatic layer 20 or 20A are formed by sputtering. In this manner, according to the method for forming the antireflection layer 10 and the antistatic layer 20 or 20A by sputtering, as compared with the case where each layer is formed merely by vapor deposition, not only can the hardness of the antireflection layer 10 and the antistatic layer 20 or 20A be improved as a whole, but also excellent adhesion of the antireflection layer 10 and the antistatic layer 20 or 20A to the substrate 5, and also excellent interlayer adhesion of the antireflection layer 10 and the antistatic layer 20 or 20A are obtained. As a result, this can contribute to the improvement of the abrasion resistance of the light transmissive members 1, 1A, and 1C.

Further, in the production method for the light transmissive members 1, 1A, and 1C according to the above-mentioned embodiments and modification, in the configuration in which as the transparent electrically conductive film layer 25, a film composed of not ITO but composed mainly of niobium-doped titanium dioxide is used, and also as the low-refractive index layer 22 or 22A of the antistatic layer 20 or 20A, silicon oxide is used, it is preferred to perform vapor deposition by an ion-assisted method.

Figure 4:
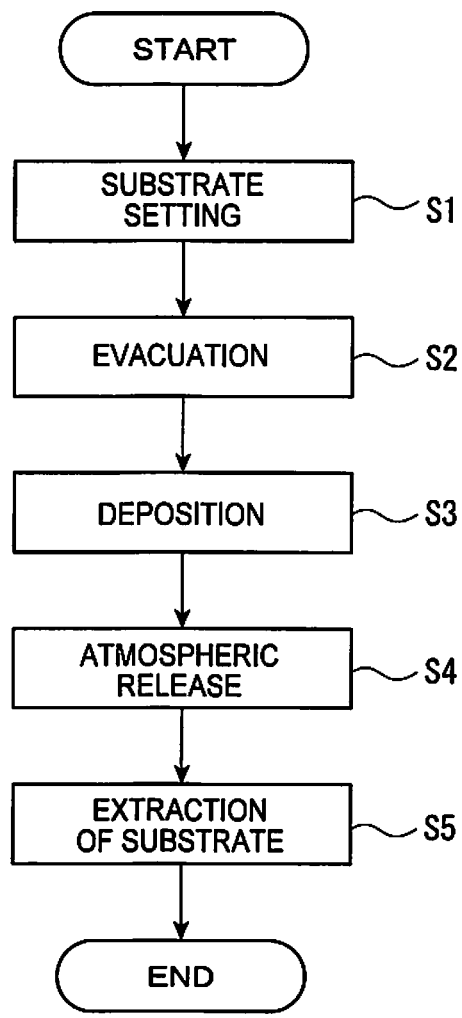
FIG. 4 is a flowchart showing one example of a light transmissive member production method.

FIG. 4 is a flowchart showing one example of the light transmissive member production method in which vapor deposition is performed using an ion-assisted method.

In the light transmissive member production method shown in FIG. 4, first, in Step S1, substrate setting is performed such that a film formation tool mounted with the substrate 5 is attached to a window of a substrate installation member of a film formation apparatus, and then, the substrate installation member and a vapor deposition source are set inside a chamber. At this time, an electrification member is disposed along a peripheral portion of the substrate installation member.

Subsequently, in Step S2, evacuation inside the chamber is performed by operating a suction device.

Thereafter, in Step S3, while rotating the substrate installation member, an electron beam is irradiated by an electron gun, whereby silicon oxide or magnesium fluoride placed in a first vapor deposition source or silicon nitride or niobium-doped titanium dioxide (TNO) placed in a second vapor deposition source is deposited. At this time, by performing accelerated irradiation with ionized oxygen from an ion source, a low-refractive index layer of silicon oxide, magnesium fluoride, or the like and a high-refractive index layer of silicon nitride or the like or a metal oxide layer of niobium-doped titanium dioxide (included in the high-refractive index layer) are alternately deposited on the substrate 5.

After the deposition in Step S3, the pressure in the chamber is returned to the atmospheric pressure (atmospheric release) in Step S4, and then, the substrate installation member to which the substrate 5 having layers formed thereon is attached is extracted from the chamber (Step S5), and thus, vapor deposition by an ion-assisted method is completed.

According to the light transmissive member production method in which vapor deposition is performed by an ion-assisted method described above, the following effect can be exhibited.

Niobium-doped titanium dioxide is known as a transparent electrically conductive film having high stability and an excellent optical property, however, for example, in the case where a film is formed by a vacuum vapor deposition method, due to the effect of niobium contained as a sub-component, the film is blackened unless high energy is applied, and so on, and the optical property may be deteriorated.

According to the light transmissive member production method in which a film is formed by vapor deposition using an ion-assisted method as described above, the above-mentioned problem caused by a vacuum vapor deposition method is solved, and a transparent electrically conductive film layer composed of niobium-doped titanium dioxide and having an excellent optical property can be stably formed.

Timepiece

Next, the timepiece according to the invention will be described.

The timepiece according to the invention includes the light transmissive member according to the invention as described above.

According to this, a timepiece capable of favorably visually recognizing a state on a rear surface side of the light transmissive member can be provided, and the aesthetic appearance (aestheticity) of the timepiece as a whole can be made excellent, and thus, the value as an ornament can be increased. In addition, for example, the visibility of the time and the like can be improved, and therefore, also the function (practicality) as a utility article becomes excellent. Further, a timepiece including the light transmissive member having an excellent antistatic function while having a sufficient light transmission property can be provided, and for example, a timepiece in which the occurrence of an adverse effect of static electricity is effectively prevented can be provided, and thus, the reliability of the timepiece as a whole can be made high.

The timepiece according to the invention may be any as long as it includes the light transmissive member according to the invention as at least one optical component, and as the other components, known components can be used, however, hereinafter, one example of the configuration of the timepiece when the light transmissive member according to the invention is applied to a cover glass will be representatively described.

Figure 5:
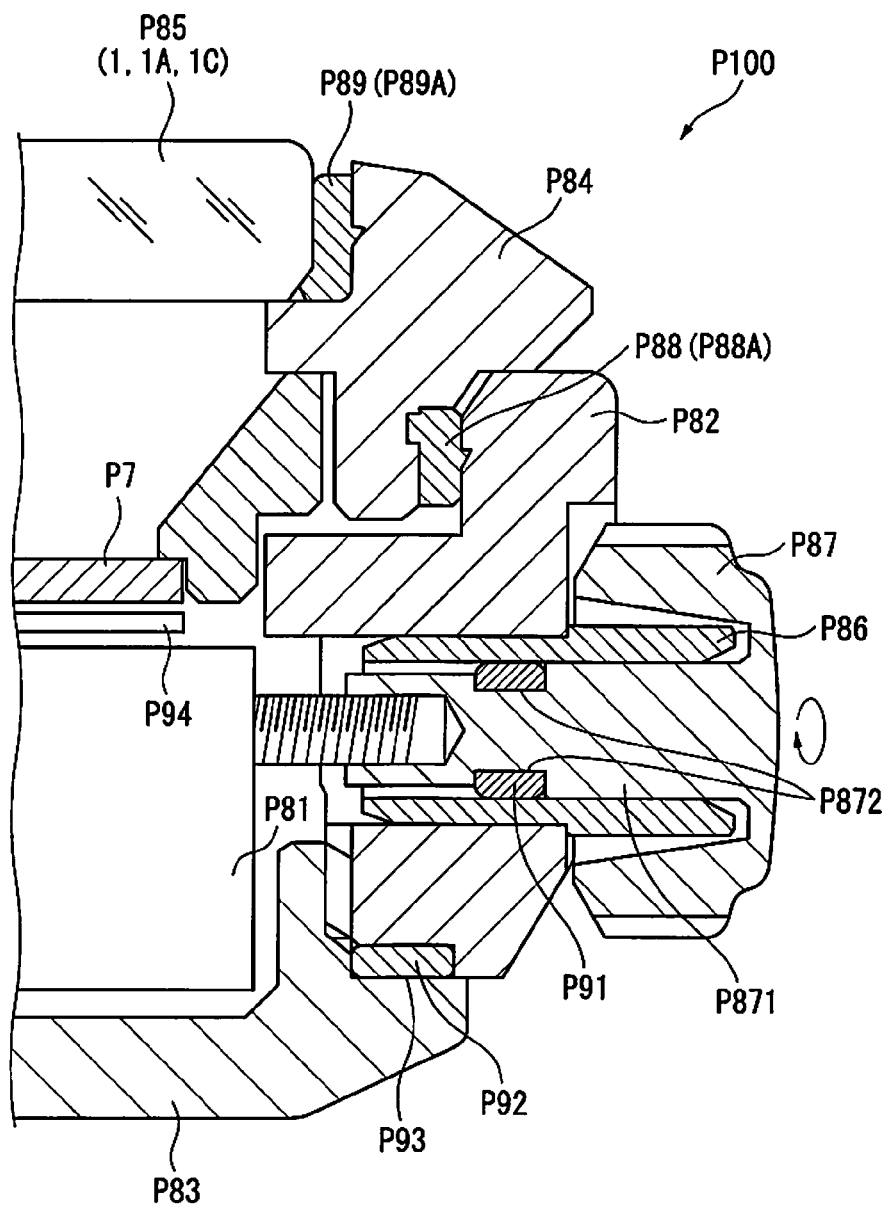
FIG. 5 is a partial cross-sectional view showing a preferred embodiment of a timepiece (portable timepiece) according to the invention.

FIG. 5 is a partial cross-sectional view showing a preferred embodiment of the timepiece (portable timepiece) according to the invention.

As shown in FIG. 5, a wristwatch (portable timepiece) P100 of this embodiment includes a case (barrel) P82, a back cover P83, a bezel (frame) P84, and a cover glass (a cover glass for a timepiece) P85. In the case P82, a dial plate for a timepiece (a dial plate) P7, a solar cell P94, and a movement P81 are housed, and further, hands (indicator hands) not shown in the drawing and the like are also housed.

The cover glass P85 is composed of the light transmissive member 1, 1A, or 1C according to the invention as described above, and is provided for the case P82 for housing the timepiece body of the wristwatch P100 as a cover glass (windscreen) for a timepiece.

According to this, the visibility of the dial plate P7, the hands (indicator hands), and the like can be enhanced, and also electrification of the cover glass P85 is suppressed by the antistatic effect of the light transmissive member 1, 1A, or 1C, and therefore, adhesion of foreign substances due to static electricity can be suppressed. Further, by suppressing electrification of the cover glass P85, a problem that the tips of the indicator hands are attracted by the electrified cover glass P85 is avoided, and therefore, it is not necessary to increase the distance between the cover glass P85 and the indicator hands, and thus, this can contribute to the reduction in thickness and size of the wristwatch P100.

Further, in the wristwatch P100 using the light transmissive member 1, 1A, or 1C according to the invention as the cover glass P85, which is a cover member, the antireflection layer 10 (see FIGS. 1 to 3) is formed in a portion on the outside between a portion on the inside and a portion on the outside of the cover glass P85. According to this, the reflection of light incident from the outside of the cover glass P85 can be prevented on the incident side, and therefore, an advantage of obtaining a more favorable antireflection effect than in the case where the antireflection layer is formed in a portion on the emission side which is the inside of the cover glass P85 is exhibited.

Further, the dial plate P7 and the like are members which have a great influence on the appearance of the entire timepiece, however, undesirable light reflection when the dial plate P7 and the like are visually recognized is prevented by the excellent antireflection effect of the light transmissive member 1, 1A, or 1C, and therefore, the aesthetic appearance (aestheticity) of the timepiece as a whole can be made particularly excellent.

The movement P81 drives the indicator hands by utilizing the electromotive force of the solar cell P94.

Although not shown in FIG. 5, in the movement P81, for example, an electric double-layer capacitor which stores the electromotive force of the solar cell P94, a lithium ion secondary buttery, a crystal oscillator as a time reference source, a semiconductor integrated circuit which generates a driving pulse for driving the timepiece based on the oscillation frequency of the crystal oscillator, a step motor for driving the indicator hands every second by receiving this driving pulse, a gear train mechanism for transmitting the movement of the step motor to the indicator hands, and the like are included.

Further, the movement P81 includes an antenna for receiving a radio wave (not shown), and has a function to perform time adjustment and the like using the received radio wave.

The solar cell P94 has a function to convert light energy into electrical energy. The electrical energy converted by the solar cell P94 is utilized for driving the movement P81 or the like.

The solar cell P94 has, for example, a PIN structure in which a p-type impurity and an n-type impurity are selectively introduced into a non-single crystalline silicon thin film, and further, an i-type non-single crystalline silicon thin film having a low impurity concentration is provided between a p-type non-single crystalline silicon thin film and an n-type non-single crystalline silicon thin film.

In the case P82, a winding stem pipe P86 is fitted and fixed, and in this winding stem pipe P86, a shaft P871 of a crown P87 is rotatably inserted.

The case P82 in which the timepiece body is housed in this manner is provided with the cover glass P85 composed of the above-mentioned light transmissive member 1, 1A, or 1C. Specifically, the case P82 and the bezel P84 are fixed to each other with a plastic packing P88, and the bezel P84 and the cover glass P85 are fixed to each other with a plastic packing P89. That is, the bezel P84 is a holding member which holds the cover glass P85.

In the case P82, the back cover P83 is fitted (or threadedly engaged), and in a joint portion (seal portion) P93 of these members, a ring-shaped rubber packing (back cover packing) P92 is inserted in a compressed state. According to this configuration, the seal portion P93 is sealed in a liquid-tight manner, whereby a water-proof function is obtained.

A groove P872 is formed in a middle part on an outer periphery of the shaft P871 of the crown P87, and in this groove P872, a ring-shaped rubber packing (crown packing) P91 is fitted. The rubber packing P91 is in close contact with the inner peripheral surface of the winding stem pipe P86 and compressed between the inner peripheral surface and the inner surface of the groove P872. According to this configuration, liquid-tight sealing is provided between the crown P87 and the winding stem pipe P86, so that a water-proof function is obtained. Incidentally, when the crown P87 is rotated, the rubber packing P91 rotates along with the shaft P871 and moves in the circumferential direction while being in close contact with the inner peripheral surface of the winding stem pipe P86.

Third Embodiment

Next, another embodiment of the timepiece according to the invention will be described as a third embodiment.

Even if the cover glass P85 includes the antistatic layer 20 or 20A, when the cover glass P85 is cleaned or the like, the cover glass P85 may sometimes be electrified.

In the above-mentioned timepiece, the cover glass P85 is fixed to the bezel P84 with the plastic packing P89 having an insulating property. Due to this, electric charges generated in the cover glass P85 hardly escape to the bezel P84 or the case P82. Therefore, there is a problem that when the cover glass P85 is electrified, it takes time until the electric charges are released.

In order to solve this problem, in the timepiece according to this embodiment, in place of the plastic packing P89, a packing P89A (see FIG. 5) having electrical conductivity is provided between the outer peripheral surface of the cover glass P85 and the bezel P84. Further, in place of the plastic packing P88, a packing P88A (see FIG. 5) having electrical conductivity is provided between the bezel P84 and the case P82. As such packings P89A and P88A, a packing formed from an electrically conductive fluororubber can be used.

According to this, the cover glass P85 and the bezel P84 are electrically connected with each other through the packing P89A, and the bezel P84 and the case P82 are electrically connected with each other through the packing P88A.

According to this embodiment, electric charges generated in the cover glass P85 escape to the bezel P84 through the packing P89A and further escape to the case P82 through the packing P88A. Due to this, as compared with the case where the respective packings P89A and P88A have an insulating property, electric charges easily escape from the cover glass P85, and thus, the time required for releasing electric charges can be reduced.

As a result, the adhesion of foreign substances to the outside of the cover glass P85 can be further suppressed, and also the distance between the cover glass P85 and the indicator hands can be further decreased.

Fourth Embodiment

Next, still another embodiment of the timepiece according to the invention will be described as a fourth embodiment.

Figure 6:
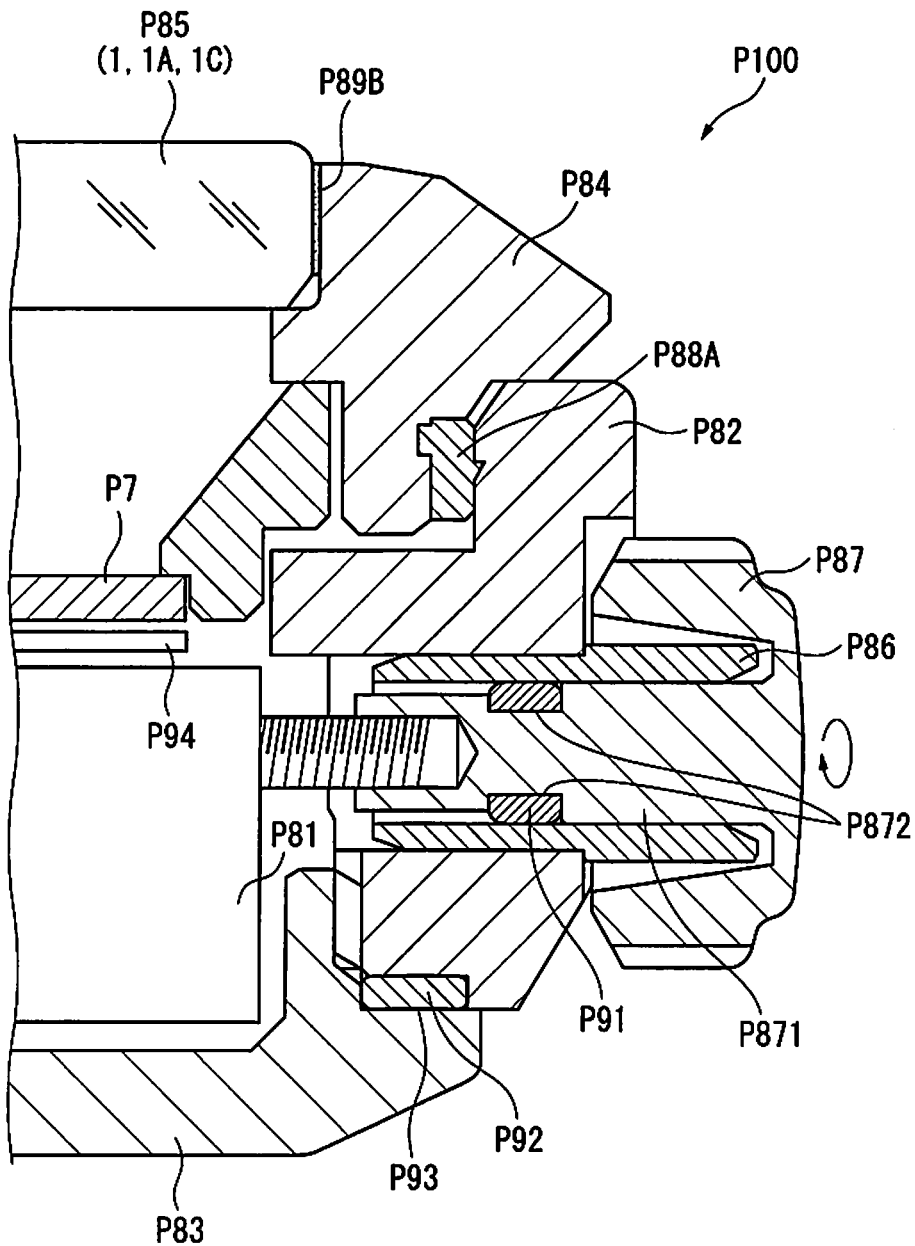
FIG. 6 is a partial cross-sectional view showing another preferred embodiment of a timepiece (portable timepiece) according to the invention.

As shown in FIG. 6, in the timepiece according to this embodiment, a packing is not provided between the cover glass P85 and the bezel P84, and the cover glass P85 and the bezel P84 are bonded to each other with an adhesive P89B provided between the outer peripheral surface of the cover glass P85 and the bezel P84. Here, the adhesive P89B has electrical conductivity. The other configuration is the same as that of the third embodiment. As the adhesive P89B, an adhesive formed by including metal particles of Ag or the like in an adhesive material such as an epoxy resin can be exemplified. Examples of the metal particles include particles of Ni, Cu, Al, and Au other than Ag.

According to this, the cover glass P85 and the bezel P84 are electrically connected with each other through the adhesive P89B.

According to this embodiment, electric charges generated in the cover glass P85 escape to the bezel P84 through the adhesive P89B and further escape to the case P82 through the packing P88A. Due to this, as compared with the case where the adhesive P89B and the packing P88A have an insulating property, electric charges easily escape from the cover glass P85, and thus, the time required for releasing electric charges can be reduced.

As a result, the adhesion of foreign substances to the outside of the cover glass P85 can be further suppressed, and also the distance between the cover glass P85 and the indicator hands can be further decreased.

In the above-mentioned third and fourth embodiments, the packing P88A provided between the bezel P84 and the case P82 has electrical conductivity, however, the invention is not limited thereto. That is, the packing P88A may not have electrical conductivity. Also in this case, electric charges generated in the cover glass P85 escape to the bezel P84 through the packing P89A or the adhesive P89B, and therefore, the time required for releasing electric charges can be reduced.

Further, in the above-mentioned third and fourth embodiments, in place of the rubber packing P92, a packing having electrical conductivity may be provided between the case P82 and the back cover P83. According to this, electric charges generated in the cover glass P85 can be made to escape also to the back cover P83 through the bezel P84 and the case P82, and therefore, the time required for releasing electric charges from the cover glass P85 can be further reduced.

In order to further facilitate the escape of electric charges, in place of the rubber packing P91, a packing having electrical conductivity may be provided between the shaft P871 of the crown P87 and the winding stem pipe P86.

Further, in the above-mentioned third and fourth embodiments, the bezel P84 is not provided, and the cover glass P85 may be fixed to the case P82 through the packing P89A or the adhesive P89B. In this case, the case P82 corresponds to the holding member which holds the cover glass P85. In this case, electric charges generated in the cover glass P85 escape to the case P82 through the packing P89A or the adhesive P89B.

Further, in the above-mentioned third and fourth embodiments, either or both of the bezel P84 and the case P82 may be formed from a material having electrical conductivity such as a metal. According to this, as compared with the case where the bezel P84 and the case P82 are formed from a material having an insulating property, the escape of electric charges generated in the cover glass P85 can be further facilitated.

In the above description, as one example of the timepiece, a timepiece including a cover glass as the light transmissive member according to the invention is described, however, the timepiece according to the invention may be a timepiece including, for example, a component to which the light transmissive member according to the invention is applied as the component other than the cover glass. For example, the back cover or the like may be one composed of the light transmissive member according to the invention. According to this, the effect as described above is obtained, and also the aesthetic appearance (aestheticity) of the timepiece as a whole can be improved.

Further, in the above description, as one example of the timepiece, a wristwatch (portable timepiece) as a solar radio timepiece is described, however, the invention can also be applied to other types of timepieces such as portable timepieces other than wristwatches, table clocks, and wall clocks in the same manner. Further, the invention can also be applied to any timepieces such as solar timepieces other than solar radio timepieces and radio timepieces other than solar radio timepieces.

Hereinabove, embodiments of the invention made by the present inventors are specifically described, however, the invention is not limited to the embodiments described above, and various changes can be made without departing from the gist of the invention.

For example, in the light transmissive member and the timepiece according to the invention described above, the configuration of each part can be replaced with an arbitrary configuration exhibiting a similar function, and also an arbitrary configuration can be added.

For example, the light transmissive member may include a foundation layer between the substrate 5 and the antireflection layer 10 or the antistatic layer 20 or 20A.

Further, in the light transmissive member according to the invention, each of the antireflection layer and the antistatic layer may have a configuration such that a plurality of antireflection layers or antistatic layers are stacked on one another through an intermediate layer.

The entire disclosure of Japanese Patent Application Nos. 2016-007664, filed Jan. 19, 2016, and 2016-191741, filed Sep. 29, 2016 are expressly incorporated by reference herein.

What is claimed is:

1. A light transmissive member, comprising a substrate having a light transmission property, wherein
   on one surface of the substrate, an antireflection layer in which a layer composed of silicon oxide ($SiO_2$) and a layer composed of silicon nitride (SiNx) are alternately stacked is formed,
   on the other surface of the substrate, an antistatic layer including at least a transparent electrically conductive film layer is formed,
   the antistatic layer is formed by alternately stacking a first refractive index layer and a second refractive index layer having a lower refractive index than that of the first refractive index layer,
   one of the first refractive index layers is the transparent electrically conductive film layer, and different one of the first refractive index layers is a layer composed of the same material as that of the transparent electrically conductive film layer or a layer composed of silicon nitride, and
   the second refractive index layer is a layer composed of silicon oxide.

2. A light transmissive member, comprising a substrate having a light transmission property, wherein on one surface of the substrate, an antireflection layer in which a layer composed of silicon oxide ($SiO_2$) and a layer composed of silicon nitride (SiNx) are alternately stacked is formed, and on the other surface of the substrate, an antistatic layer including at least a transparent electrically conductive film layer is formed, the antistatic layer is formed by alternately stacking a first refractive index layer and a second refractive index layer having a lower refractive index than that of the first refractive index layer, one of the first refractive index layers is the transparent electrically conductive film layer, and different one of the first refractive index layers is a layer composed of the same material as that of the transparent electrically conductive film layer or a layer composed of silicon nitride, and the second refractive index layer is a layer having a lower refractive index than that of the transparent electrically conductive film layer and that of the layer composed of silicon nitride.

3. The light transmissive member according to claim 2, wherein the second refractive index layer is a layer composed of magnesium fluoride ($MgF_2$).

4. The light transmissive member according to claim 1, wherein the transparent electrically conductive film layer is a layer composed of a material for forming a transparent electrode.

5. The light transmissive member according to claim 1, wherein the transparent electrically conductive film layer is a titanium oxide layer composed mainly of titanium oxide and containing, as a sub-component, at least one element selected from the group consisting of niobium (Nb), silicon (Si), zirconium (Zr), tantalum (Ta), aluminum (Al), and hafnium (HO.

6. The light transmissive member according to claim 1, wherein the antistatic layer is formed by stacking 4 or more layers, and at least a second layer from the outermost layer of the antistatic layer is the transparent electrically conductive film layer.

7. The light transmissive member according to claim 1, wherein on the antireflection layer, an antifouling layer composed of fluorine-containing organosilicon compound is formed.

8. The light transmissive member according to claim 1, wherein the light transmissive member is a cover member, and the antireflection layer is formed in a portion on the outside between a portion on the inside and a portion on the outside of the cover member.

9. A timepiece, comprising the light transmissive member according to claim 8, wherein the light transmissive member is provided for a case which houses a timepiece body.

10. A timepiece, comprising:

the light transmissive member according to claim 8;

a holding member which holds the light transmissive member; and a packing which is provided between the light transmissive member and the holding member and has electrical conductivity.

11. A timepiece, comprising:

the light transmissive member according to claim 8;

a holding member which holds the light transmissive member; and an adhesive which bonds the light transmissive member and the holding member to each other and has electrical conductivity.

12. A light transmissive member production method which is a method for producing a light transmissive member including a substrate having a light transmission property, wherein on one surface of the substrate, an antireflection layer in which a layer composed of silicon oxide ($SiO_2$) and a layer composed of silicon nitride (SiNx) are alternately stacked is formed, and on the other surface of the substrate, an antistatic layer including at least a transparent electrically conductive film layer is formed, the light transmissive member production method comprising a sputtering step in which the antireflection layer and the antistatic layer are formed by sputtering.

13. A light transmissive member production method which is a method for producing the light transmissive member according to claim 1, comprising a sputtering step in which the antireflection layer and the antistatic layer are formed by sputtering.

14. A light transmissive member production method which is a method for producing the light transmissive member according to claim 2, comprising a sputtering step in which the antireflection layer and the antistatic layer are formed by sputtering.

15. A light transmissive member production method which is a method for producing the light transmissive member according to claim 3, comprising a sputtering step in which the antireflection layer and the antistatic layer are formed by sputtering.

16. A light transmissive member production method which is a method for producing the light transmissive member according to claim 4, comprising a sputtering step in which the antireflection layer and the antistatic layer are formed by sputtering.

17. A light transmissive member production method which is a method for producing the light transmissive member according to claim 5, comprising a sputtering step in which the antireflection layer and the antistatic layer are formed by sputtering.

18. A light transmissive member production method which is a method for producing the light transmissive member according to claim 1, wherein as the transparent electrically conductive film layer, niobium-doped titanium dioxide is used, and as the second refractive index layer, a layer composed of silicon oxide is used, and the antistatic layer is formed by performing vapor deposition using an ion-assisted method.

19. A light transmissive member production method which is a method for producing the light transmissive member according to claim 2, wherein as the transparent electrically conductive film layer, niobium-doped titanium dioxide is used, and as the second refractive index layer, a layer composed of silicon oxide is used, and the antistatic layer is formed by performing vapor deposition using an ion-assisted method.

* * * * *